US011177590B2

(12) United States Patent
Zhou et al.

(10) Patent No.: US 11,177,590 B2
(45) Date of Patent: Nov. 16, 2021

(54) PRINTED CIRCUIT BOARD WITH A CONNECTOR FOR ELECTRIC CONNECTION OF THE PCB WITH ANOTHER APPARATUS

(71) Applicant: Intel Corporation, Santa Clara, CA (US)

(72) Inventors: Yongcai Zhou, Shanghai (CN); Lu She, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/614,533

(22) PCT Filed: Jun. 19, 2017

(86) PCT No.: PCT/CN2017/088968
§ 371 (c)(1),
(2) Date: Nov. 18, 2019

(87) PCT Pub. No.: WO2018/232555
PCT Pub. Date: Dec. 27, 2018

(65) Prior Publication Data
US 2020/0185846 A1 Jun. 11, 2020

(51) Int. Cl.
*H01R 12/58* (2011.01)
*H01R 12/70* (2011.01)
(Continued)

(52) U.S. Cl.
CPC ....... *H01R 12/585* (2013.01); *H01R 12/7047* (2013.01); *H01R 12/7076* (2013.01);
(Continued)

(58) Field of Classification Search
CPC .. H01R 12/585; H01R 12/7047; H05K 1/184; H05K 3/308; H05K 5/00;
(Continued)

(56) References Cited

U.S. PATENT DOCUMENTS 5,827,386 A * 10/1998 Bhatt ................... H05K 3/0094
156/150
8,900,008 B2 * 12/2014 Day, Jr. ................ H01R 12/585
439/567

(Continued)

FOREIGN PATENT DOCUMENTS

JP        2014056710 A       3/2014

OTHER PUBLICATIONS

International Search Report and Written Opinion dated Mar. 23, 2018 for International Application No. PCT/CN2017/088968, 10 pages.

*Primary Examiner* — Briggitte R. Hammond
(74) *Attorney, Agent, or Firm* — Schwabe, Williamson & Wyatt, P.C.

(57) ABSTRACT

Embodiments of the present disclosure provide an apparatus comprising a printed circuit board (PCB) with a connector to electrically connect the PCB with another apparatus. In embodiments, the apparatus may include a PCB having a via that begins on a first surface of the PCB and ends inside the PCB. The apparatus may further include a connector to electrically connect the PCB with another apparatus or another portion of the apparatus. The connector may include a pin to provide connectivity between the PCB and the connector. The pin may be inserted into the via in response to an attachment of the connector to the PCB. The PCB may include a space that extends from an end of the via inside the PCB to a second surface of the PCB opposite the first surface, to accommodate layers for signal routing inside the PCB. Other embodiments may be described and/or claimed.

15 Claims, 6 Drawing Sheets

(51) Int. Cl.
*H05K 1/18* (2006.01)
*H05K 3/30* (2006.01)
(52) U.S. Cl.
CPC .............. *H05K 1/184* (2013.01); *H05K 3/308* (2013.01); *H05K 2201/1059* (2013.01); *H05K 2201/10189* (2013.01); *H05K 2203/167* (2013.01)
(58) Field of Classification Search
CPC . H05K 2201/10189; H05K 2201/1059; H05K 2203/167
See application file for complete search history.

(56) References Cited

U.S. PATENT DOCUMENTS

| | | |
|---|---|---|
| 10,064,271 B2 | 8/2018 | Yi et al. |
| 2004/0144564 A1 | 7/2004 | Hoffmann |
| 2012/0106105 A1* | 5/2012 | Sugane ................. H05K 3/421 361/752 |
| 2012/0302075 A1* | 11/2012 | Muraoka ................ H05K 1/115 439/78 |
| 2017/0149156 A1 | 5/2017 | Beucler et al. |

* cited by examiner

PRINTED CIRCUIT BOARD WITH A CONNECTOR FOR ELECTRIC CONNECTION OF THE PCB WITH ANOTHER APPARATUS

CROSS REFERENCE TO RELATED APPLICATIONS

The present application is a national phase entry under 35 U.S.C. § 371 of International Application No. PCT/CN2017/088968, filed Jun. 19, 2017, entitled "A PRINTED CIRCUIT BOARD WITH A CONNECTOR FOR ELECTRIC CONNECTION OF THE PCB WITH ANOTHER APPARATUS", which designated, among the various States, the United States of America. The disclosure of International Application No. PCT/CN2017/088968 is hereby incorporated by reference in its entirety.

FIELD

Embodiments of the present disclosure generally relate to the field of printed circuit board fabrication and in particular to techniques for providing connectors and routing for a printed circuit board.

BACKGROUND

Currently, computer products, such as printed circuit boards (PCB) may be required to accommodate high density design, due to demands provided by high performance computing (HPC), communications, cloud computing, and storage. In order to accommodate such requirements, PCBs may be connected together, e.g., in board-to-board connections. Accordingly, there may be many types of connectors attached to a PCB, such as press-fit board-to-board connectors, high speed bus connectors on board, and the like. Those connectors may have dozens or even hundreds of density pins, which may be installed into a PCB via through holes.

It may be challenging to fan out all the signals, especially the high speed differential signals, as the connectors' pins may break the space inside the PCB and thus limit trace routing. Accordingly, extra layers may need to be added to a PCB to accommodate necessary routing. However, adding extra layers to a PCB may increase the cost of the PCB. Also, adding extra layers to a PCB may also increase overall board thickness, which may cause mechanical issues in chassis accommodating the PCB.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure include techniques and configurations for an apparatus comprising a printed circuit board (PCB) with a connector to electrically connect the PCB with another apparatus. In embodiments, the apparatus may include a PCB having a via that begins on a first surface of the PCB and ends inside the PCB. The apparatus may further include a connector to electrically connect the PCB with another apparatus or another portion of the apparatus. The connector may include at least one pin to provide electrical connectivity between the PCB and the connector. The via may receive the pin in response to an attachment of the connector to the first surface of the PCB. The PCB may include a space inside the PCB that extends from an end of the via inside the PCB to a second surface of the PCB opposite the first surface, to accommodate one or more layers for signal routing inside the PCB.

In the following detailed description, reference is made to the accompanying drawings that form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
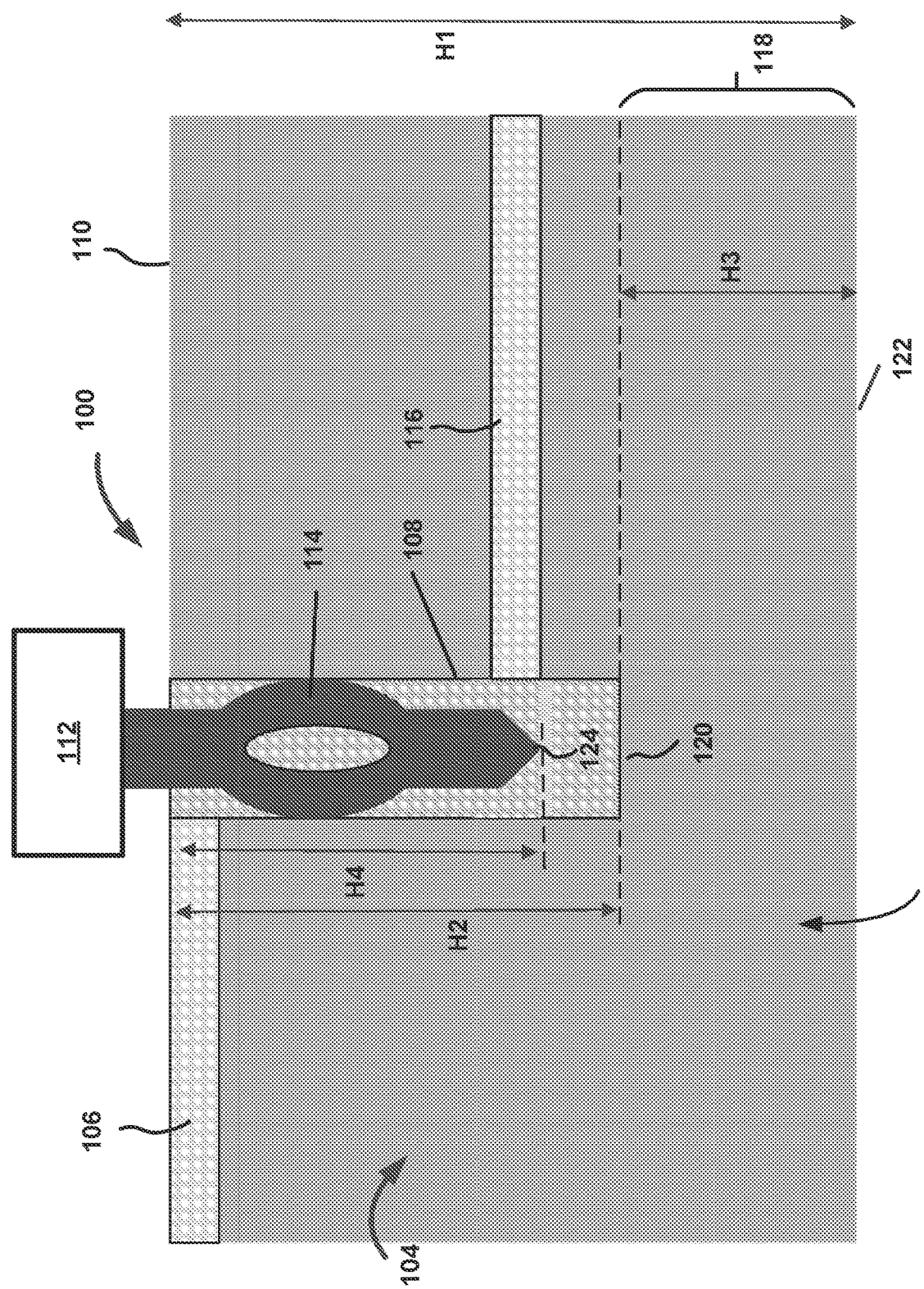
FIG. 1 illustrates an example apparatus comprising a PCB with a connector for electric connection with another apparatus, in accordance with some embodiments.

FIG. 1 illustrates an example apparatus comprising a PCB with a connector for electric connection with another apparatus, in accordance with some embodiments. More specifically, FIG. 1 shows a side view of a portion of the example apparatus 100. The apparatus 100 may include a PCB 102, which may be compiled by stacking multiple layers on a substrate 104. Some of the layers may be conductive or include conductive traces (e.g., layer 106) and may be used to route electric signals between the components (not shown) disposed on the PCB 102. In general, different components may be disposed on the PCB 102. Some of these components may comprise integrated circuits (IC), and others may comprise discrete components of different types, such as capacitors, inductors, resistors, or other types of electric components.

In embodiments, the PCB 102 may include one or more blind vias, e.g., a via 108 that may begin on a first (e.g., top, bottom or side) surface 110 of the PCB 102, and may end inside the PCB 102. For purposes of explanation, one via 108 is shown in FIG. 1. However, it will be understood that any number of blind vias may be disposed in the PCB 102, to accommodate the components of the apparatus 100 according to the embodiments described herein. The blind via 108 may be provided in accordance with conventional methods, such as by drilling or using other laser or mechanical processes. For example, the PCB 102 may be compiled by multiple layers, some of which may have through holes in respective positions, in order to obtain the blind via 108. In embodiments, the via 108 may be plated, to provide electrical connectivity as described below.

In embodiments, the apparatus 100 may include a connector 112 to electrically connect the PCB 102 with another apparatus or another portion of the apparatus 100. For example, the connector 112 (schematically shown by the quadrangle in FIG. 1) may serve to connect the PCB 102 with another PCB (not shown).

In some embodiments, the connector 112 may comprise a press-fit connector. For example, the connector 112 may include one or more pins 114 (one pin is shown in FIG. 1 for purposes of explanation) to provide electrical connectivity between the components of the PCB 102 and the connector 112 via the plated surface of the blind via 108, and further via a trace (or conductive layer) 116. As shown, the blind via 108 may be configured to receive the pin 114 in response to an attachment (e.g., fastening by press fit) of the connector 112 to the first surface 110 of the PCB 102. Accordingly, the pin 114 may provide electrical connectivity and mechanical retention capabilities for the connector 112 and PCB 102.

The PCB 102 may have a height (thickness) H1, and the blind via 108 may have a length H2, which is less than H1. Accordingly, there may be a space 118 inside the PCB 102, the thickness of which is indicated by H3. The space 118 may be defined as extending from an end 120 of the blind via 108 to a second surface 122 of the PCB 102 located opposite the first surface 110 as shown. In embodiments, the space 118 may be configured to accommodate one or more layers for signal routing inside the PCB 102.

In conventional solutions, press-fit connectors may be attached to a PCB via through holes, which extend through the PCB and thus may limit signal routing inside the PCB. In contrast, the described embodiments may provide for the space 118 under press-fit pin 114, inside inner layers of the PCB 102. This space may be free of through holes and may be available for and dedicated to signal routing. Further, the blind vias provided in a PCB according to the described embodiments may have short via stubs, which may benefit the signals quality, especially for high speed bus connections in the PCB. Also, there may be no need to provide additional routing (conductive) layers to a PCB configured in accordance with the described embodiments. Accordingly, PCB manufacturing costs may be reduced. Also, a PCB provided according to the described embodiments may have reduced thickness, compared to conventional PCB.

In embodiments, the pin 114 (or a portion of the pin 114 configured to be insertable into the blind via 108) may have a length H4. As shown, H4 may be less than the length H2 of the via 108, to provide clearance between an end 124 of the pin 114 and the layers that may be disposed in the space 118 for signal routing.

In embodiments, the connector 112 may be a board-to-board connector, for example, a vertical connector or a right angle board-to-board connector, which may be used in backplane, mid-plane, or mezzanine solutions. In some embodiments, the connector 112 may be a wire-to-board connector, for example a mini-serial attached small computer system interface (SCSI, known as SAS) high density (HD) connector, or a small form-factor pluggable (SFP) or quad small form-factor pluggable (QSFP) connector.

In embodiments, the PCB 102 may be a mid-plane, a back-plane, or a mezzanine board and may be used in server solutions, for example. The PCB may have a thickness H1 of about 100 mil (one thousandth of an inch) or more. The space 118 may be configured to accommodate, about eight to eighteen layers for signal routing. For example, the number of conductive (routing) layers may be reduced to eighteen for mid-plane solutions according to the described embodiments, in contrast to conventional mid-plane solutions, in which about twenty-six routing layers may be required.

Figure 2:
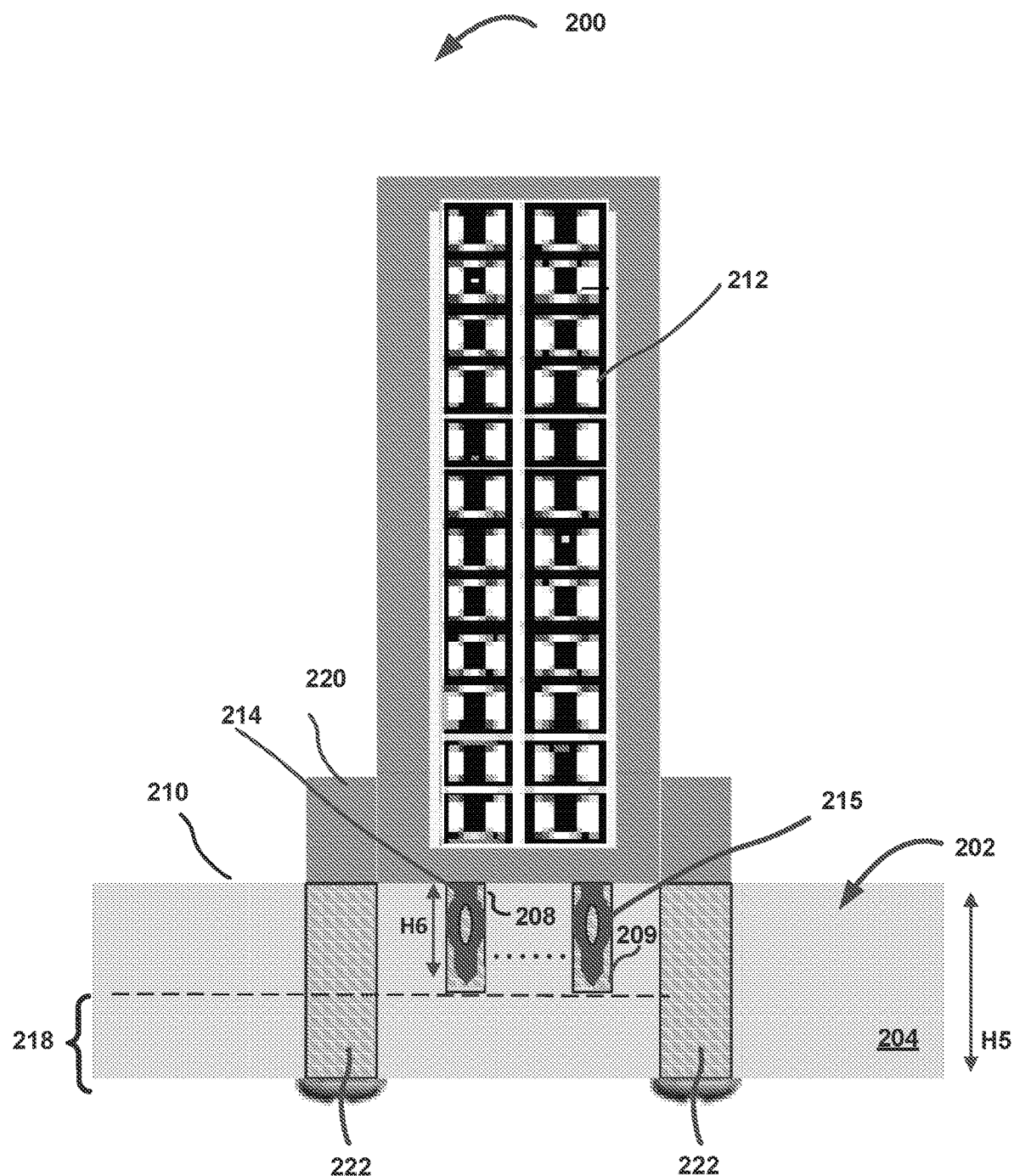
FIG. 2 illustrates another example apparatus comprising a PCB with a connector for electric connection with another apparatus, in accordance with some embodiments.

FIG. 2 illustrates another example apparatus comprising a PCB with a connector for electric connection with another apparatus, in accordance with some embodiments. More specifically, FIG. 2 shows a side view of a portion of the example apparatus 200. Similar to FIG. 2, the apparatus 100 may include a PCB 202, which may be compiled by stacking multiple layers on a substrate 204.

In embodiments, the PCB 202 may include one or more blind vias, e.g., vias 208, 209 that may begin on a first (e.g., top, bottom or side) surface 210 of the PCB 202, and may end inside the PCB 202. For purposes of explanation, two vias 208, 209 are shown in FIG. 1.

In embodiments, the apparatus 200 may include a connector 212 to electrically connect the PCB 202 with another apparatus or another portion of the apparatus 200. For example, the connector 212 (schematically shown by the quadrangle in FIG. 1) may serve to connect the PCB 202 with another PCB (not shown).

In embodiments, the connector 212 may comprise a press-fit connector and may include one or more pins 214, 215 (two pins are shown in FIG. 2 for purposes of explanation) to provide electrical connectivity between the components of the PCB 202 and the connector 212. As shown, the blind vias 208, 209 may be configured to receive respective pins 214, 215 in response to an attachment (e.g., fastening by press fit) of the connector 212 to the first surface 210 of the PCB 202. Accordingly, the pins 214, 215 may provide electrical connectivity and mechanical retention capabilities for the connector 212 and PCB 202.

In embodiments, the PCB 202 may have a thickness H5 of about 60 mil and 90 mil, e.g., it may be thinner than the PCB 102 of FIG. 1. Accordingly, in order to advantageously use blind vias 208, 209 and allow for a space 218 under the vias to accommodate signal routing layers, the length H6 of the pins 214, 215 may be reduced, compared to the length H4 of the pin 114 of FIG. 1. For example, the length H6 may be about 40 mil. Similar to the embodiments, of FIG. 1, H6 of the pins may be less than the length of the respective vias 208, 209, to provide clearance between respective ends of the pins 214, 215 and the layers that may be disposed in the space 218 for signal routing. In embodiments, the space 218 may be sufficient to provide two layers for signal routing, for example, one signal layer and one reference plane, or two layers comprising voltage reference planes.

To compensate for the reduced sizes of the pins 214, 215 and vias 208, 209 (compared to the embodiments of FIG. 1), the retention provided by the press fit connection of these components may be reinforced in some embodiments. For example, in order to improve mechanical retention of the connector 212 on the PCB 202, a mechanical structure may be provided to secure the connector 212 on the PCB 202. Such structure may include, for example, a housing 220 with coupling components 222 configured to enforce mechanical retention of the connector 212 on the PCB 202. In embodiments, the coupling components may comprise screws to attach the housing 220 with the connector 212 to the PCB 202, as shown. Any other coupling components may also be used. The mechanical structures may be used for any type of press fit connectors, such as board-to-board right angle connectors (shown in FIG. 2) or other types of board-to-board connectors.

Figure 3:
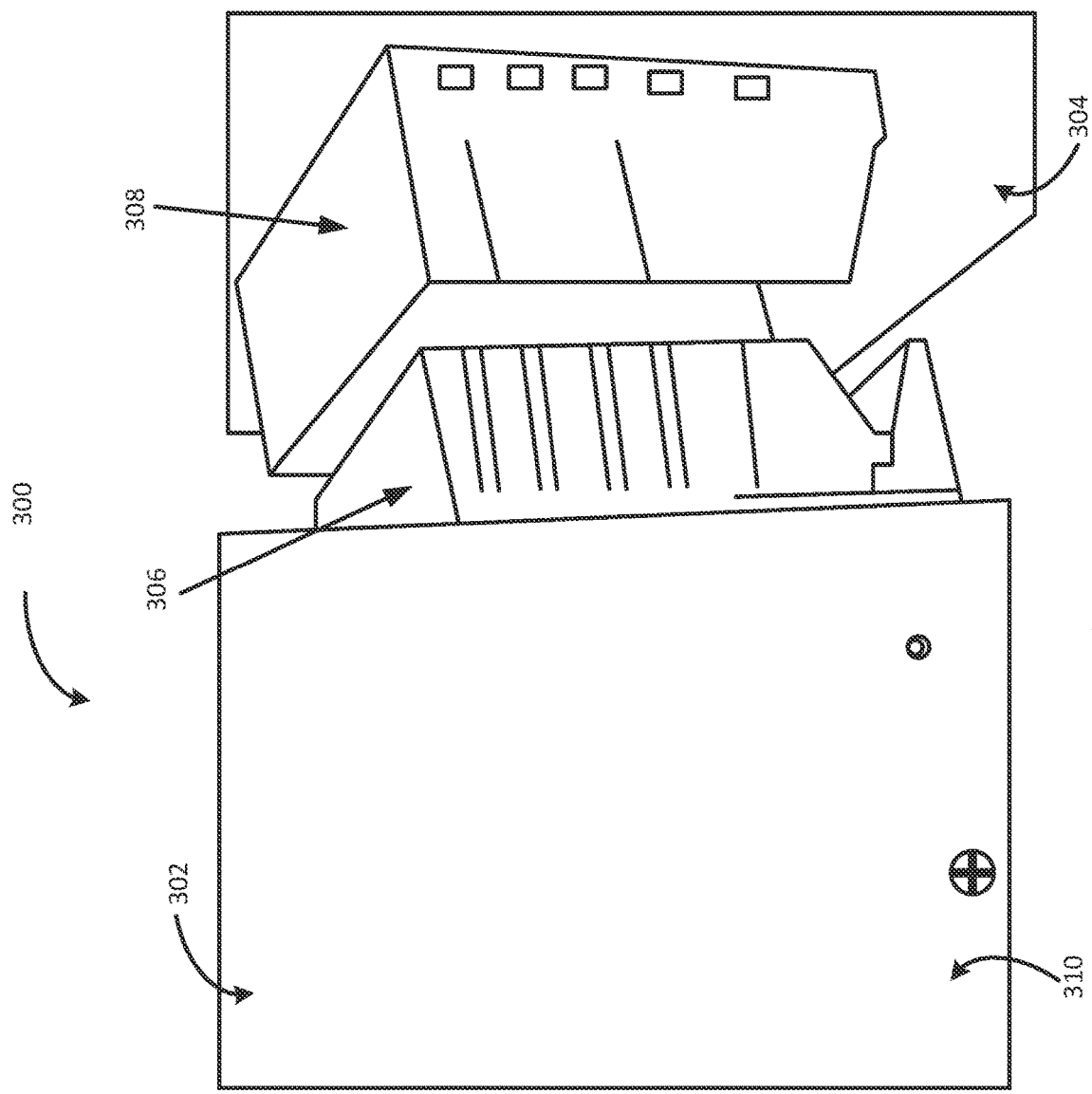
FIGS. 3-4 illustrate example apparatuses comprising a PCB with a connector for electric connection with another apparatus, provided in accordance with embodiments of FIGS. 1-2.
Figure 4:
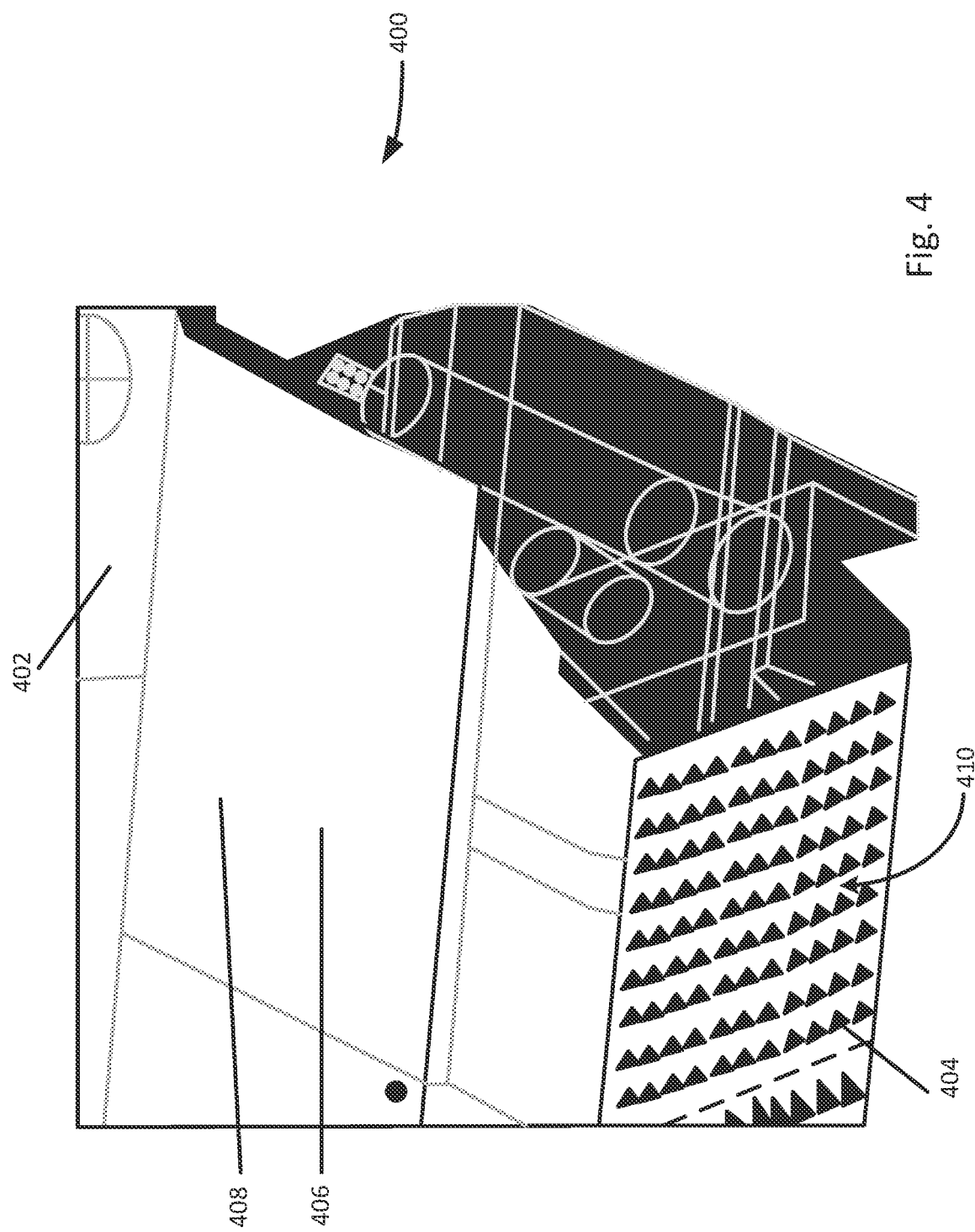

FIGS. 3-4 illustrate example apparatuses comprising a PCB with a connector for electric connection with another apparatus, provided in accordance with embodiments of FIGS. 1-2.

FIG. 3 illustrates a bottom view of an example apparatus 300 comprising PCB 302 and 304 connected by the board-to-board connectors 306 and 308. As shown, connector 306 may be a right angle connector, and connector 308 may be a vertical connector. The connector 308 may be attached to the PCB 304 using the blind vias and corresponding pins as described in reference to FIG. 1. Note that the vias may not be seen in the PCB bottom layer 310.

FIG. 4 illustrates a perspective view of a portion of an example apparatus 400 comprising a PCB 402 and a press fit connector 404 attached to the PCB 404 in accordance with the embodiments of FIG. 1. The pins 406 of the connector 404 are inserted into respective blind vias 408, to provide for a space to accommodate multiple routing layers on the PCB 404. Note that the vias may not be seen in the PCB bottom layer 410.

Figure 5:
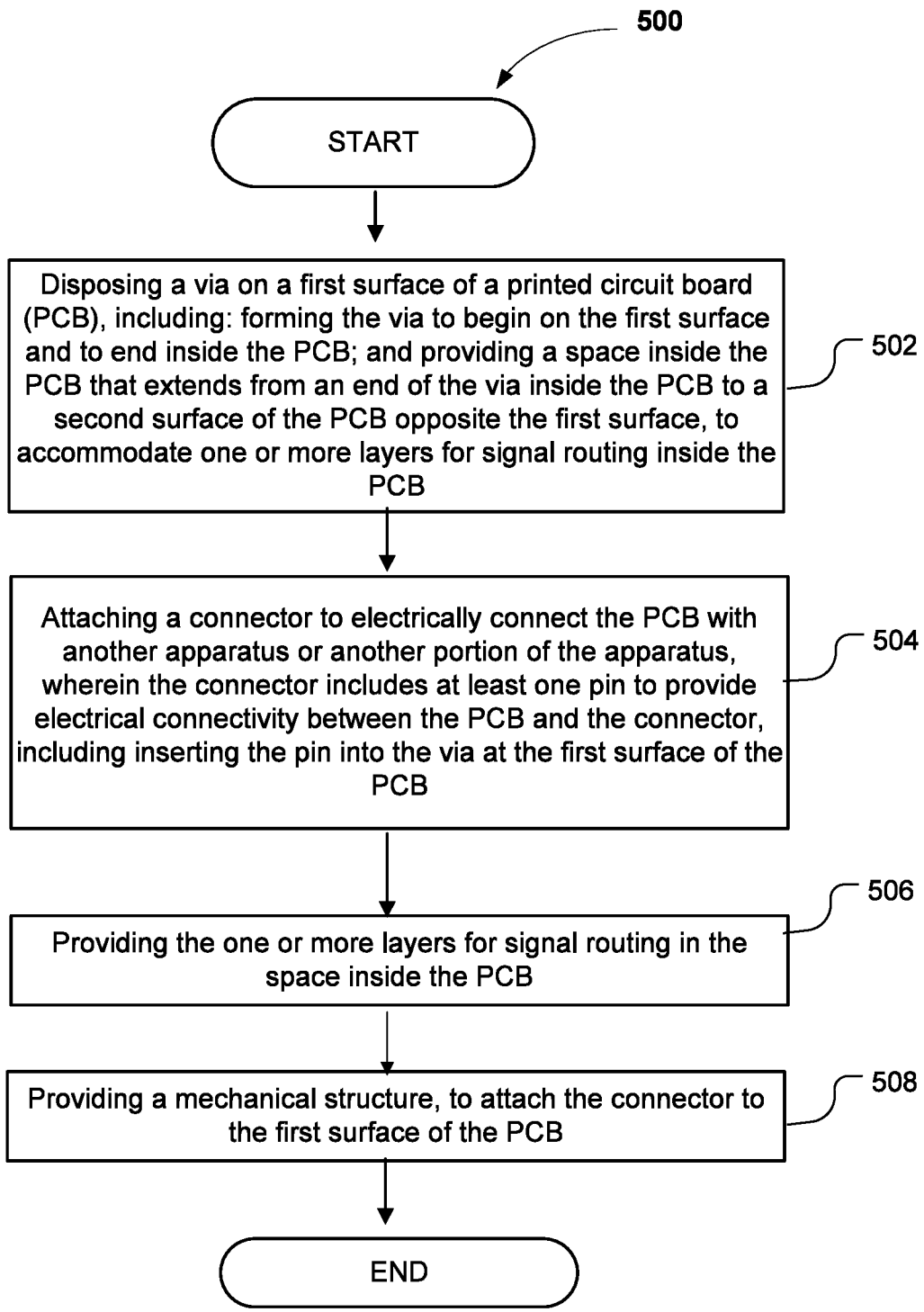
FIG. 5 is an example process flow diagram for providing apparatus comprising a PCB with a connector with a connector for electric connection with another apparatus, in accordance with some embodiments.

FIG. 5 is an example process flow diagram for providing apparatus comprising a PCB with a connector with a connector for electric connection with another apparatus, in accordance with some embodiments. The process 500 may comport with embodiments described in reference to FIGS. 1-2. The actions described in the process 500 may occur in a different order or in parallel; the order provided below is for purposes of illustration and does not limit this disclosure.

The process 500 may begin at block 502 and include disposing a via on a first surface of a PCB. This may include forming the via to begin on the first surface and to end inside the PCB, and providing a space inside the PCB that extends from an end of the via inside the PCB to a second surface of the PCB opposite the first surface, to accommodate one or more layers for signal routing inside the PCB.

At block 504, the process 500 may include attaching a connector to electrically connect the PCB with another apparatus or another portion of the apparatus. The connector may include at least one pin to provide electrical connectivity between the PCB and the connector. Attaching the connector may include inserting the at least one pin into the via at the first surface of the PCB.

At block 506, the process 500 may include providing the one or more layers for signal routing in the space inside the PCB. As discussed in reference to FIGS. 1-2, the layers may comprise eight or more in some embodiments, or two or more in other embodiments, depending on the thickness of the PCB and length of the pins.

At block 508, the process 500 may include providing a mechanical structure, to attach the connector to the first surface of the PCB. As discussed in reference to FIG. 2, I some instances (e.g., when the PCB has a thickness between 60 and 90 mil and the pins of the connector have a length about 40 mil), additional mechanical structure to improve retention of the connector on the PCB may be desired.

Figure 6:
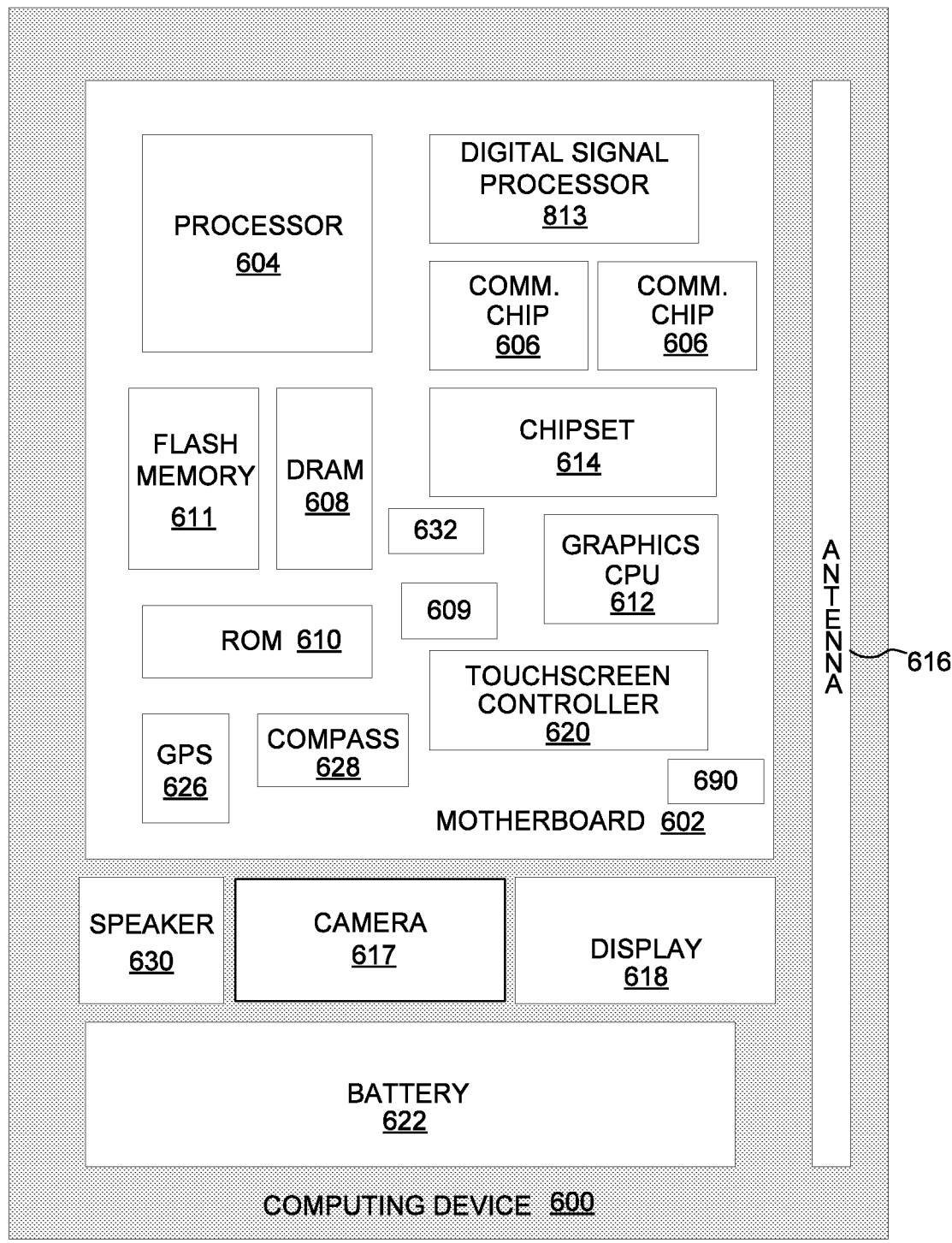
FIG. 6 illustrates an example computing device that may employ the apparatuses and/or methods described herein, according to various embodiments.

FIG. 6 illustrates an example computing device 600 that may employ the apparatuses and/or methods described herein, according to various embodiments.

The motherboard 602 may include a number of components, including but not limited to a processor 604 and at least one communication chip 606. In embodiments, the motherboard 602 may comprise a PCB similar to 102 or 202 of FIGS. 1-2, and a connector 690 may be disposed on the motherboard 602. The connector 690 may comprise a connector configured similarly to 112 or 212 of FIGS. 1-2, and may be disposed on the motherboard 602 using the techniques described in reference to FIGS. 1-2 (e.g., using blind vias and connector pins). The processor 604 may be physically and electrically coupled to the motherboard 602. In some implementations, the communication chip 606 may also be physically and electrically coupled to the motherboard 602. In further implementations, the communication chip 606 may be part of the processor 604. In addition, the computing device 600 may further include an antenna 616.

Depending on its applications, the computing device 600 may include other components that may or may not be physically and electrically coupled to the motherboard 602. Some of these components are shown in FIG. 6 for purposes of explanation. These other components may include, but are not limited to, volatile memory (e.g., dynamic random-access memory (DRAM)) 608, static random access memory (SRAM) 609, non-volatile memory (e.g., read-only memory (ROM)) 610, flash memory 611, a graphics central processing unit (CPU) 612, a digital signal processor 613, a chipset 614, a display (e.g., a touchscreen display) 618, a touchscreen controller 620, a battery 622, an audio codec, a video codec, a power amplifier (not shown), a global positioning system (GPS) device 626, a compass 628, a Geiger counter, an accelerometer, a gyroscope (not shown), a speaker 630, a camera 617, and a mass storage device 632. These components may be included in IC packages, some of which may be disposed on 602.

The communication chip 606 may enable wireless communications for the transfer of data to and from the computing device 600. The communication chip 606 may implement any of a number of wireless standards or protocols, including but not limited to Institute for Electrical and Electronic Engineers (IEEE) standards including Wi-Fi (IEEE 802.7 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards.

The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, EV-DO, and others.

In various implementations, the computing device 600 may be a server, a mobile computing device, a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

The embodiments described herein may be further illustrated by the following examples.

Example 1 may be an apparatus, comprising: a printed circuit board (PCB) having a via that begins on a first surface of the PCB and ends inside the PCB; and a connector to electrically connect the PCB with another apparatus or another portion of the apparatus, wherein the connector includes at least one pin to provide electrical connectivity between the PCB and the connector, wherein the via is to receive the at least one pin in response to an attachment of the connector to the first surface of the PCB, wherein the PCB includes a space inside the PCB that extends from an end of the via inside the PCB to a second surface of the PCB opposite the first surface, to accommodate one or more layers for signal routing inside the PCB.

Example 2 may include the apparatus of example 1, wherein the PCB has a thickness of 100 mil or more, wherein the one or more layers comprise at least ten layers.

Example 3 may include the apparatus of example 2, wherein the connector comprises a press-fit board-to-board connector, wherein the PCB comprises one of: a mid-plane, a back-plane, or a mezzanine.

Example 4 may include the apparatus of example 1, wherein the pin has a length that is less than a length of the via, to provide clearance between an end of the pin and the one or more layers provided for signal routing.

Example 5 may include the apparatus of example 1, wherein the PCB has a thickness between about 60 mil and 90 mil, wherein the connector comprises a press-fit board-to-board connector, and wherein the pin has a length of about 40 mil.

Example 6 may include the apparatus of example 5, wherein the one or more layers comprise at least two layers.

Example 7 may include the apparatus of example 6, further comprising a mechanical structure coupled with the connector, to attach the connector to the first surface of the PCB.

Example 8 may include the apparatus of example 7, wherein the mechanical structure comprises a housing to house the connector, and a coupling component to attach the housing to the first surface of the PCB.

Example 9 may include the apparatus of example 1, wherein the connector comprises one of: a vertical board-to-board connector, a right angle board-to-board connector, or a wire-to-board connector.

Example 10 may include the apparatus of example 1, wherein the via comprises a blind via.

Example 11 may include the apparatus of any of examples 1 to 10, wherein the apparatus and another apparatus or another portion of the apparatus comprise a computing device.

Example 12 may be an apparatus, comprising: a processor; a memory coupled with the processor; a printed circuit board (PCB) to receive the processor and memory; and a connector attached to the PCB to electrically connect the PCB with another apparatus or another portion of the apparatus, wherein the connector includes at least one pin to provide electrical connectivity between the PCB and the connector, wherein the PCB includes: a via that begins on a first surface of the PCB and ends inside the PCB, to receive the at least one pin; and a space that extends from an end of the via inside the PCB to a second surface of the PCB opposite the first surface, to accommodate one or more layers for signal routing inside the PCB.

Example 13 may include the apparatus of example 12, wherein the pin has a length that is less than a length of the via, to provide clearance between an end of the pin and the one or more layers provided for signal routing.

Example 14 may include the apparatus of example 12, wherein the PCB has a thickness of 100 mil or more, wherein the one or more layers comprise at least ten layers.

Example 15 may include the apparatus of example 12, wherein the PCB has a thickness between about 60 mil and 90 mil, wherein the one or more layers comprise at least two layers.

Example 16 may include the apparatus of example 14, further comprising a mechanical structure coupled with the connector, to attach the connector to the first surface of the PCB.

Example 17 may include the apparatus of any examples 12 to 16, wherein the connector comprises a press-fit connector, and wherein the apparatus comprises a server.

Example 18 may be a method, comprising: disposing a via on a first surface of a printed circuit board (PCB), disposing the via including: forming the via to begin on the first surface and to end inside the PCB; and providing a space inside the PCB that extends from an end of the via inside the PCB to a second surface of the PCB opposite the first surface, to accommodate one or more layers for signal routing inside the PCB; and attaching a connector to electrically connect the PCB with another apparatus or another portion of the apparatus, wherein the connector includes at least one pin to provide electrical connectivity between the PCB and the connector, wherein attaching the connector includes inserting the at least one pin into the via at the first surface of the PCB.

Example 19 may include the method of example 18, further comprising: providing the one or more layers for signal routing in the space inside the PCB.

Example 20 may include the method of example 18, wherein the pin has a length that is shorter than a length of the via, to provide clearance between an end of the pin and the one or more layers provided for signal routing.

Example 21 may include the method of example 18, wherein the PCB has a thickness of 100 mil or more, wherein providing the one or more layers includes forming at least eight layers for signal routing in the space inside the PCB.

Example 22 may include the method of any examples 18 to 21, wherein the PCB has a thickness between about 60 mil and 90 mil, wherein the pin has a length of about 40 mil, wherein providing the one or more layers includes forming at least two layers for signal routing in the space inside the PCB.

Example 23 may include the method of example 22, further comprising: providing a mechanical structure, to attach the connector to the first surface of the PCB.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus, comprising:
a printed circuit board (PCB) having a via that begins on a first surface of the PCB and ends inside the PCB;
a connector to electrically connect the PCB with another apparatus or another portion of the apparatus, wherein the connector includes at least one pin to provide electrical connectivity between the PCB and the connector, wherein the via is to receive the at least one pin in response to an attachment of the connector to the first surface of the PCB; and
a mechanical structure coupled with the connector, to attach the connector to the first surface of the PCB, wherein the mechanical structure comprises a housing to house the connector, and a coupling component to attach the housing to the first surface of the PCB,
wherein the PCB includes a space inside the PCB that extends from an end of the via inside the PCB to a second surface of the PCB opposite the first surface, to accommodate at least two layers for signal routing inside the PCB, wherein the PCB has a thickness between about 60 mil and 90 mil, wherein the connector comprises a press-fit board-to-board connector, and wherein the pin has a length of about 40 mil.

2. The apparatus of claim 1, wherein the PCB has a thickness of 100 mil or more, wherein the at least two layers comprise at least ten layers.

3. The apparatus of claim 2, wherein the connector comprises a press-fit board-to-board connector, wherein the PCB comprises one of: a mid-plane, a back-plane, or a mezzanine.

4. The apparatus of claim 1, wherein the pin has a length that is less than a length of the via, to provide clearance between an end of the pin and the at least two layers provided for signal routing.

5. The apparatus of claim 1, wherein the connector comprises one of: a vertical board-to-board connector, a right angle board-to-board connector, or a wire-to-board connector.

6. The apparatus of claim 1, wherein the via comprises a blind via.

7. The apparatus of claim 1, wherein the apparatus and another apparatus or another portion of the apparatus comprise a computing device.

8. An apparatus, comprising:
a processor;
a memory coupled with the processor;
a printed circuit board (PCB) to receive the processor and memory;
a connector attached to the PCB to electrically connect the PCB with another apparatus or another portion of the apparatus, wherein the connector includes at least one pin to provide electrical connectivity between the PCB and the connector, and
a mechanical structure coupled with the connector, to attach the connector to a first surface of the PCB, wherein the mechanical structure comprises a housing to house the connector, and a coupling component to attach the housing to the first surface of the PCB,
wherein the PCB includes: a via that begins on the first surface of the PCB and ends inside the PCB, to receive the at least one pin; and a space that extends from an end of the via inside the PCB to a second surface of the PCB opposite the first surface, to accommodate at least two layers for signal routing inside the PCB, wherein the PCB has a thickness between about 60 mil and 90 mil, wherein the connector comprises a press-fit board-to-board connector, and wherein the pin has a length of about 40 mil.

9. The apparatus of claim 8, wherein the pin has a length that is less than a length of the via, to provide clearance between an end of the pin and the at least two layers provided for signal routing.

10. The apparatus of claim 8, wherein the at least two layers comprise at least ten layers.

11. The apparatus of claim 8, wherein the apparatus comprises a server.

12. A method, comprising:
disposing a via on a first surface of a printed circuit board (PCB), disposing the via including: forming the via to begin on the first surface and to end inside the PCB; and providing a space inside the PCB that extends from an end of the via inside the PCB to a second surface of the PCB opposite the first surface, to accommodate at least two layers for signal routing inside the PCB;
attaching a connector to electrically connect the PCB with another apparatus or another portion of the apparatus, wherein the connector includes at least one pin to provide electrical connectivity between the PCB and the connector, wherein attaching the connector includes inserting the at least one pin into the via at the first surface of the PCB; and
providing a mechanical structure, to attach the connector to the first surface of the PCB, wherein the mechanical structure comprises a housing to house the connector, and a coupling component to attach the housing to the first surface of the PCB, wherein the PCB has a thickness between about 60 mil and 90 mil, wherein the connector comprises a press-fit board-to-board connector, and wherein the pin has a length of about 40 mil.

13. The method of claim 12, further comprising: providing the at least two layers for signal routing in the space inside the PCB.

14. The method of claim 12, wherein the pin has a length that is shorter than a length of the via, to provide clearance between an end of the pin and the at least two layers provided for signal routing.

15. The method of claim 12, wherein the PCB has a thickness of 100 mil or more, wherein providing the at least two layers includes forming at least eight layers for signal routing in the space inside the PCB.

* * * * *